(12) United States Patent
Wang

(10) Patent No.: US 12,048,133 B2
(45) Date of Patent: Jul. 23, 2024

(54) SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/746,693

(22) Filed: May 17, 2022

(65) Prior Publication Data

US 2022/0278109 A1   Sep. 1, 2022

Related U.S. Application Data

(62) Division of application No. 16/845,641, filed on Apr. 10, 2020, now Pat. No. 11,362,095.

(30) Foreign Application Priority Data

Apr. 12, 2019 (CN) .......................... 201910295350.8

(51) Int. Cl.
*H10B 10/00* (2023.01)
*H01L 21/02* (2006.01)
(Continued)

(52) U.S. Cl.
CPC ....... *H10B 10/12* (2023.02); *H01L 21/02529* (2013.01); *H01L 21/02532* (2013.01); *H01L 21/02576* (2013.01); *H01L 21/02579* (2013.01); *H01L 21/0262* (2013.01); *H01L 21/823814* (2013.01); *H01L 21/823821* (2013.01); *H01L 27/0924* (2013.01); *H01L 29/0847* (2013.01); *H01L 29/1608* (2013.01);
(Continued)

(58) Field of Classification Search
CPC .......... H01L 29/785; H01L 21/823807; H01L 29/66795; H01L 29/7848; H01L 21/823814; H01L 29/7834; H01L 29/66636; H01L 21/823821
See application file for complete search history.

(56) References Cited

U.S. PATENT DOCUMENTS

2013/0168771 A1   7/2013   Wu et al.
2014/0293681 A1*  10/2014  Houston ............... G11C 11/412
                                                        365/154

(Continued)

FOREIGN PATENT DOCUMENTS

CN          103187418 A         7/2013

*Primary Examiner* — Brian Turner
(74) *Attorney, Agent, or Firm* — Anova Law Group, PLLC

(57) ABSTRACT

Semiconductor structures is provided. The semiconductor structure includes a semiconductor substrate having at least one first region, a plurality of second regions and a plurality of third regions; at least one second fin formed on one second region of the plurality of second region; at least one third fin formed on one third region of the plurality of third regions; a first epitaxial layer formed in the at least one first fin; and a second epitaxial layer formed in the at least one second fin and the at least one third fin.

6 Claims, 5 Drawing Sheets

(51) Int. Cl.
  *H01L 21/8238* (2006.01)
  *H01L 27/092* (2006.01)
  *H01L 29/08* (2006.01)
  *H01L 29/16* (2006.01)
  *H01L 29/165* (2006.01)
  *H01L 29/66* (2006.01)
  *H01L 29/78* (2006.01)

(52) U.S. Cl.
  CPC ...... *H01L 29/165* (2013.01); *H01L 29/66636* (2013.01); *H01L 29/7848* (2013.01)

(56) References Cited

U.S. PATENT DOCUMENTS

| | | |
|---|---|---|
| 2015/0091059 A1 | 4/2015 | Hung et al. |
| 2015/0270401 A1 | 9/2015 | Huang et al. |
| 2017/0243944 A1 | 8/2017 | Li et al. |
| 2018/0122800 A1* | 5/2018 | Cheng ................. H01L 29/7827 |
| 2018/0247929 A1* | 8/2018 | Shrivastava ........ H01L 27/0262 |
| 2018/0308852 A1* | 10/2018 | Lee ................... H01L 21/31144 |
| 2019/0214314 A1* | 7/2019 | Seo ................... H01L 29/78696 |
| 2020/0295200 A1* | 9/2020 | Xie ................... H01L 29/66636 |

* cited by examiner

SEMICONDUCTOR STRUCTURE

CROSS-REFERENCES TO RELATED APPLICATIONS

This application is a divisional of U.S. patent application Ser. No. 16/845,641, filed on Apr. 10, 2020, which claims the priority of Chinese patent application No. 201910295350.8, filed on Apr. 12, 2019, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

With the continuous development of digital integrated circuits (ICs), on-chip integrated memory has become an important part of digital systems. Static random access memory (SRAM) is an indispensable part of the on-chip memory because of its low power consumption and high speed. Static random access memory (SRAM) is able to save data as long as it is powered, and does not need to be constantly refreshed.

The static random access memory (SRAM) includes a single port bit unit, a dual-port bit unit, and a dual-port bit unit having different ports. Each unit includes a different number of pull-up transistors (PUs), pull-down transistors (PDs), and pass-gate transistors (PGs). The control switches (PGs) controlling the pull-up transistors (PUs) and the basic storage units with the bit lines for reading and writing are usually NMOS transistors; and the pull-down transistors (PDs) are usually PMOS transistors. As the process node is reduced, the sizes of the devices are getting smaller and smaller; and the performance requirements of the transistors are getting higher and higher. Thus, the performance of the pull-down transistors may be unable to meet the requirements.

Therefore, there is a need to further improve the performance of the static random access memory (SRAM). The disclosed methods and semiconductor structures are directed to solve one or more problems set forth above and other problems in the art.

BRIEF SUMMARY OF THE DISCLOSURE

One aspect of the present disclosure includes a method for forming a semiconductor structure. The method includes providing a semiconductor substrate having at least one first region, at least one second region and at least one third region. The at least one second region may be between the at least one first region and the at least one third region. The method may also include forming at least one first fin on the at least one first region, at least one second fin on the at least one second region and at least one third fin on the at least one third region; forming a first opening in the at least one first fin; forming a second opening in the at least one second fin; forming a first epitaxial layer in the first opening and the second opening; forming a third opening in the at least one third fin; removing at least a portion of the first epitaxial layer in the at least one second fin to form a fourth opening; and forming a second epitaxial layer in the third opening and the fourth opening.

Another aspect of the present disclosure includes a semiconductor structure. The semiconductor structure includes a semiconductor substrate having at least one first region, a plurality of second regions and a plurality of third regions, wherein the at least one first region is between two adjacent third regions of the plurality of third regions, one third region of the plurality of third regions is between one second region of the plurality of second regions and the at least one first region and one second region of the plurality of second regions is between two adjacent third regions of the plurality of third regions; at least one first fin formed on the at least one first region; at least one second fin formed on one second region of the plurality of second region; at least one third fin formed on one third region of the plurality of third regions; a first epitaxial layer formed in the at least one first fin; and a second epitaxial layer formed in the at least one second fin and the at least one third fin. The first epitaxial layer and the second epitaxial layer are formed by forming a first opening in the at least one first fin; forming a second opening in the at least one second fin; forming the first epitaxial layer in the first opening and the second opening; forming a third opening in the at least one third fin; removing at least a portion of the first epitaxial layer in the at least one second fin to form a fourth opening; and forming the second epitaxial layer in the third opening and the fourth opening.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
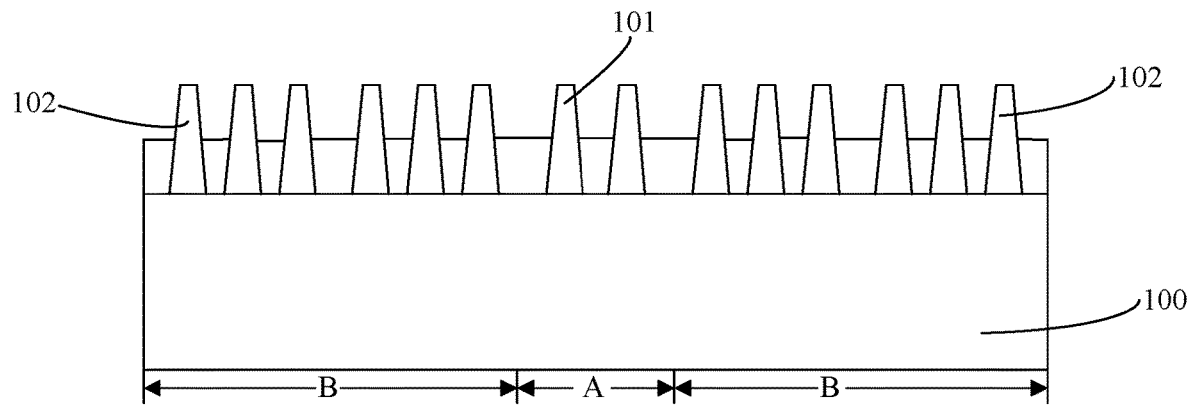
FIGS. 1-3 illustrate semiconductor structures corresponding to certain stages during a fabrication process of a static random access memory (SRAM)
Figure 2:
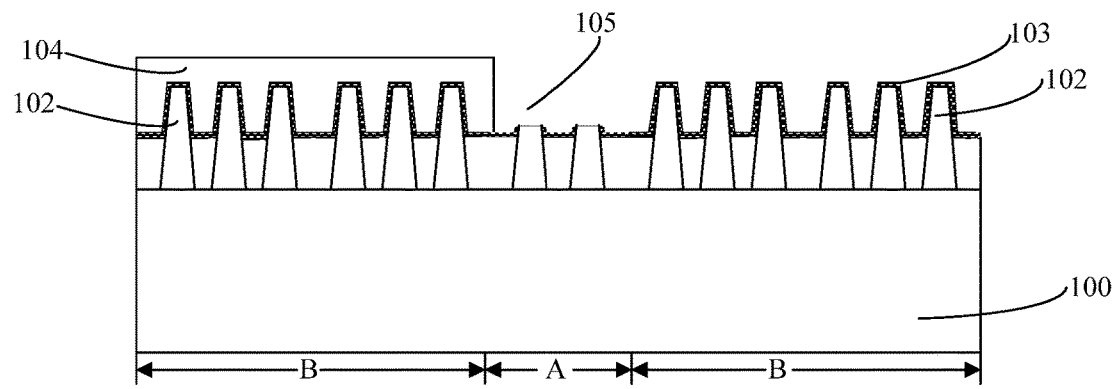
Figure 3:
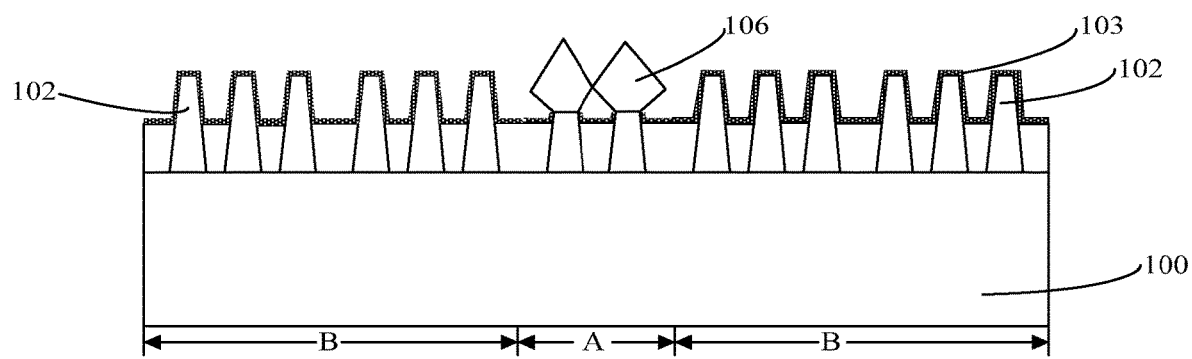

FIGS. 1-3 illustrate semiconductor structures corresponding to certain stages during a fabrication process of a static random access memory (SRAM).

As shown in FIG. 1, the fabrication process includes providing a semiconductor substrate 100. The semiconductor substrate 100 includes a first region A and a second region B. First fins 101 are formed on the first region A of the semiconductor substrate 100; and second fins 102 are formed on the second region B of the semiconductor substrate 100. Further, an isolation layer (not labeled) is formed on the semiconductor substrate 100. The isolation layer covers portions of the sidewall surfaces of the first fins 101 and the second fins 102. The top surface of the isolation layer is lower than the top surfaces of the first fins 101 and the second fins 102.

The first region A is used to form a pull-up transistor (PU), and the second region B is used to form a pull-down transistor (PD).

Further, as shown in FIG. 2, a protection layer 103 is formed on the semiconductor substrate 100, the first fins 101 and the second fins 102; and a mask layer 104 is formed on the protection layer 103. The mask layer 104 exposes the first fins 101 on the first region A. Then, the first fins 101 are etched using the mask layer 104 as a mask to form an opening 105 in the first fins 101.

Further, as shown in FIG. 3, a first epitaxial layer 106 is formed in the opening 105 by an epitaxial growth process. The material of the first epitaxial layer 106 includes silicon germanium.

The structural unit of the static random access memory (SRAM) includes one pull-up transistor(PU), six pull-down transistors (PDs), and six pass-gate transistors(PGs). In the case where the area of the first area A and the second area B has a predetermined range, it needs to form transistors in the first region A and the second region B as many as possible. The ratio of the number of the pull-up transistors (PUs) to the total number of transistors in the first region A and the second region B may be substantially small such that the area of the first region A and the second region B occupied by the pull-up transistors (PUs) is also relatively small. When forming the pull-up transistors, because the number of the first epitaxial layer 106 is small, the reaction gas for forming the first epitaxial layer 106 is consumed slowly, and the concentration of the reaction gases is substantially high when the first epitaxial layer 106 are formed. Because the pull-up transistors are typically P-type transistors, the first epitaxial layer 106 are made silicon germanium. The first epitaxial layer 106 made of the silicon germanium is grown substantially fast along the <100> and <110> crystal orientations; and grown substantially slow along the <111> crystal orientation. Thus, the sidewalls of the first epitaxial layer 106 are easy to have convex tips. Accordingly, the first epitaxy layer 106 on the adjacent first fins 101 is easy to be bridged to adversely affect the performance of the semiconductor structure.

The present disclosure provides a semiconductor structure and a method for forming a semiconductor structure. By first forming a first epitaxial layer in the second fins in the second region and in the first fins in the first region to increase the number of fins for forming the first epitaxial layers, the growth rate of the first epitaxial layer may be reduced; and the size of the first epitaxial layer along a direction parallel to the surface of the semiconductor substrate may be reduced. Thus, a short circuit caused by the bridging of the first epitaxial layer between adjacent first fins and the surrounding epitaxial layers may be reduced; and the performance of the semiconductor structure may be improved.

Figure 10:
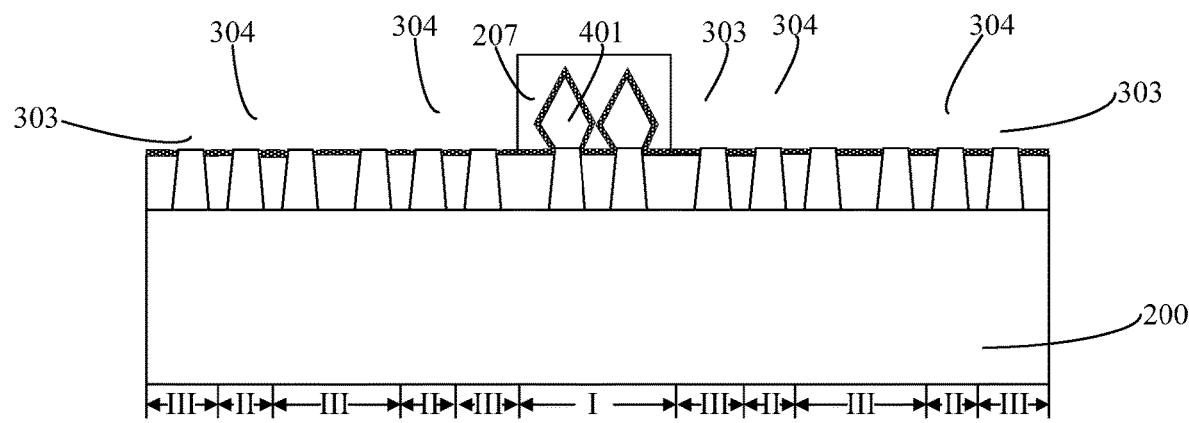
Figure 11:
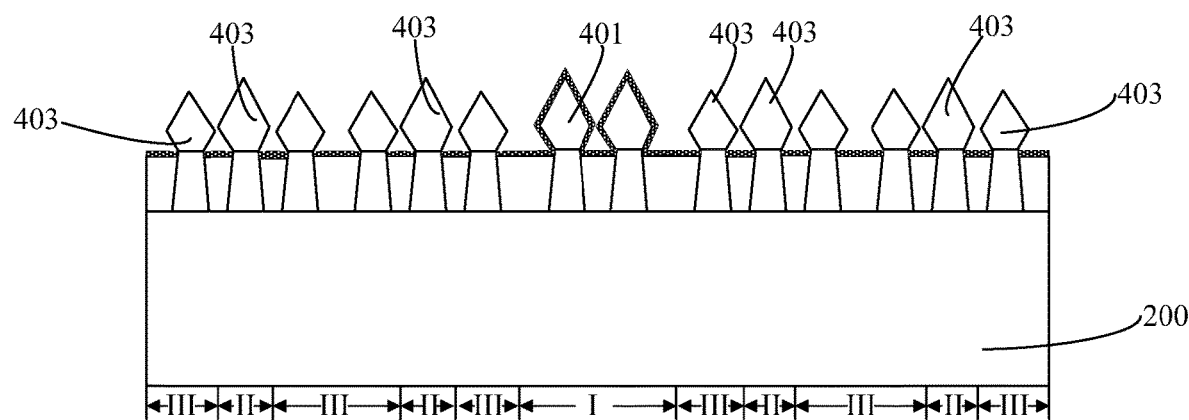
Figure 12:
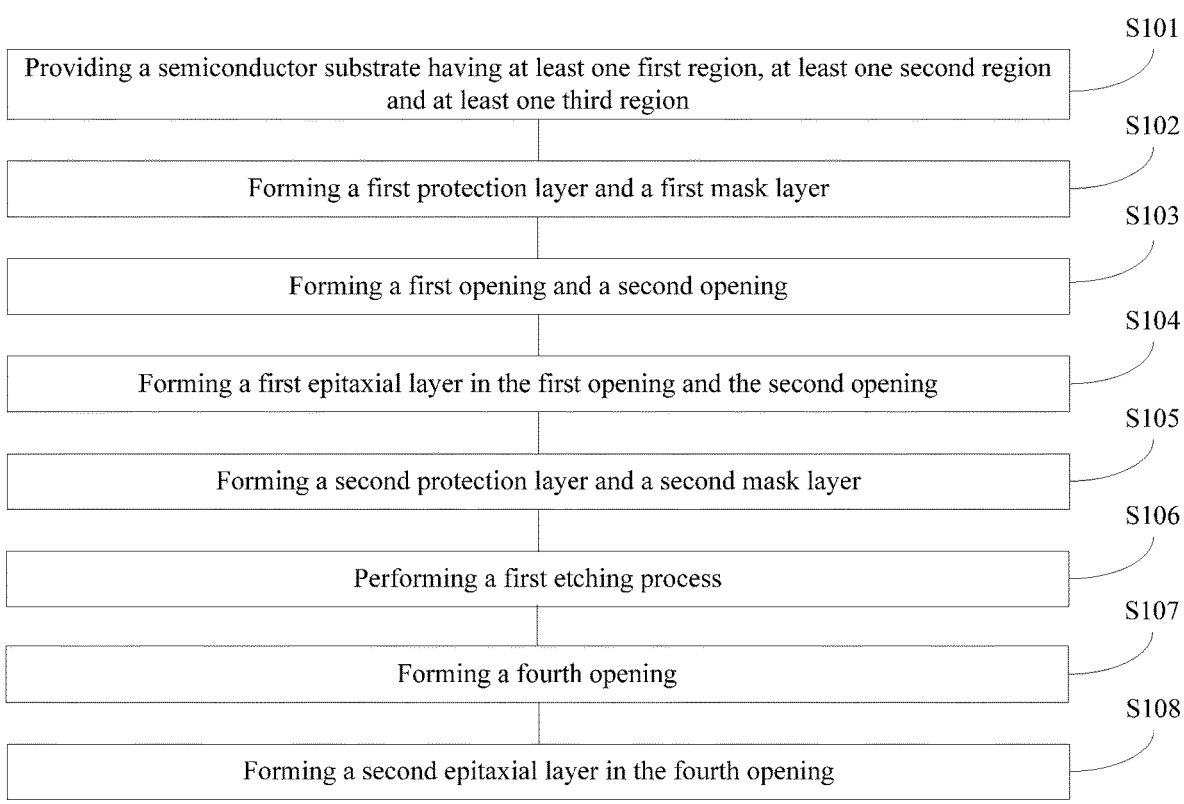
FIG. 12 illustrates an exemplary fabrication process of a static random access memory (SRAM) consistent with various disclosed embodiments of the present disclosure.

FIG. 12 illustrates an exemplary fabrication process of an SRAM consistent with various disclosed embodiments of the present disclosure. FIGS. 4-11 illustrate semiconductor structure corresponding to certain stages during the exemplary fabrication process of the SRAM consistent with various disclosed embodiments of the present disclosure.

Figure 4:
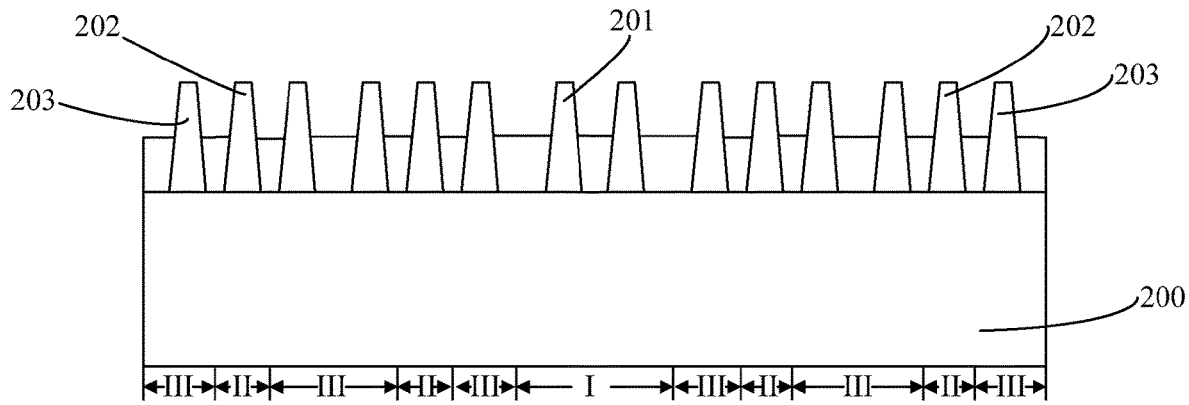
FIGS. 4-11 illustrate semiconductor structures corresponding to certain stages during an exemplary fabrication process of a static random access memory (SRAM) consistent with various disclosed embodiments of the present disclosure.

As shown in FIG. 12, at the beginning of the fabrication process, a semiconductor substrate with certain structures is provided (S101). FIG. 4 illustrates a corresponding semiconductor structure.

As shown in FIG. 4, a semiconductor substrate 200 is provided. The semiconductor substrate 200 may include at least one first region I, at least one second region II, and at least one third region III. The at least one first region I, the at least one second region II, and the at least one third region III may be distributed on the semiconductor structure 100 adjacent to each other or alternatively. At least one first fin 201 may be formed on the at least one first region I of the semiconductor substrate 200. At least one second fin 202 may be formed on the second region II of the semiconductor substrate 200. At least one third fin 203 may be formed on the third region III of the semiconductor substrate 200.

In particular, as shown in FIG. 4, the semiconductor substrate 200 may include one first region I, a plurality of second regions II and a plurality of third regions III. The first region I may be between two adjacent third regions III. The third region III adjacent to the first region I may be between one second region II and the first region I and one second region II is between two adjacent third region III.

The semiconductor substrate 200 may be made of any appropriate semiconductor material, such as single crystal silicon, polycrystalline silicon, amorphous silicon, germanium, silicon germanium, or gallium arsenide, etc. In one embodiment, the semiconductor substrate 200 is made of single crystal silicon.

In one embodiment, the at least one first region I includes one first region I; the at least one second region II includes a plurality of second regions II, and the at least on third region III includes a plurality of third regions III. Each second region may be located between two adjacent third regions III, and a second region II and an adjacent first region may be separated by a third region III.

In some embodiments, the at least one first region I includes one first region I; the at least one second region II includes one second region II; and the at least third region III includes one third region III. The third region III may be between the first region I and the second region II.

One or a plurality of first fins 201 may be formed on the at least one first region I of the semiconductor substrate 200; and the plurality first fins 201 may be arranged in parallel. One or a plurality of second fins 202 may be formed on the at least one second region II of the semiconductor substrate 200. The plurality of second fins 202 may be arranged in parallel. One third fin 203 or a plurality of third fins 203 may be formed on the at least one third region III of the semiconductor substrate 200. The plurality of third fins 203 may be arranged in parallel. In one embodiment, two first fins 201 are formed on the first region I; one second fin 202 is formed on the second region II, and one third fin 203 is formed on the third region III. In some embodiments, two first fins 201 may be formed on the first region I, one second fin 202 may be formed on the second region II, and two third fins 203 may be formed on the third region III.

In one embodiment, a first gate structure (not shown) may be formed across the at least one first fin 201; a second gate structure (not shown) may be formed across the at least one second fin 202; and a third gate structure may be formed across the at least one third fin 203. Fin field-effect transistor (FinFET) structures may be subsequently formed on the at least one first region I, the at least one second region II, and the at least one third region III.

In some embodiments, the first gate structure, the second gate structure, and the third gate structure may not be formed. Diode structures or triode structures may be subsequently formed on the at least one first region I, the at least one second region II, and the at least one third region III.

In one embodiment, a first opening may be formed in the at least one first fin 201 at both sides of the first gate structure; a second opening may be formed in the at least one second fin 202 at both sides of the second gate structure. The first opening and the second opening may be formed simultaneously. The process for forming the first opening and the second opening may be referred to FIG. 5 and FIG. 6.

In some embodiments, the second opening may be formed after the first opening is formed. In other embodiments, the first opening may be formed after the second opening is formed.

Figure 5:
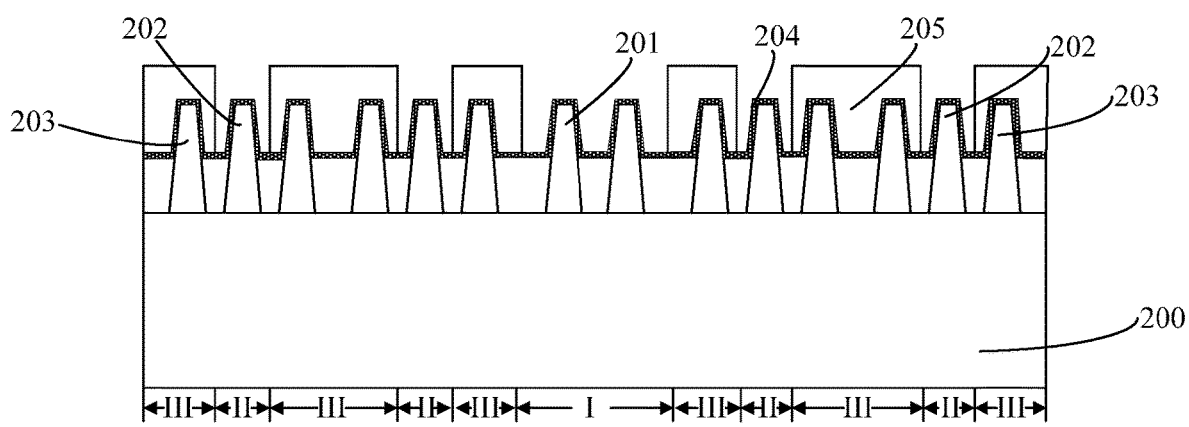

Returning to FIG. 12, after providing the semiconductor substrate with the certain structures, a first protection layer and a first mask layer may be formed (S102). FIG. 5 illustrates a corresponding semiconductor structure.

As shown in FIG. 5, a first protection layer 204 may be formed on the at least one first fin 201, the at least one second fin 202, and the at least one third fin 203; and a first mask layer 205 may be formed on the first protection layer 204. The first mask layer 205 may expose a portion of the first protection layer 204 on the at least one first fin 201 and a portion of the first protection layer 204 on the at least one second fin 202.

In one embodiment, the first protection layer 204 may be made of silicon nitride. The first protection layer 204 may be formed by a deposition process, such as a chemical vapor deposition process or a physical vapor deposition process, etc.

The purpose for forming the first protection layer 204 on the at least one first fin 201, the at least one second fin 202, and the at least one third fin portion 203 is to protect certain regions during the subsequent processes. In particular, a first opening may be formed in the at least one first fin 201 and a second opening may be subsequently formed in the at least one second fin 202. Then, a first epitaxial layer may be formed in the first opening and the second opening. When forming the first epitaxial layer, the first protection layer 204 may be used to protect the regions where the first epitaxial layer is not formed, and the damage to the at least one third fin when forming the first epitaxial layer may be prevented.

In one embodiment, the first mask layer 205 may be a photoresist layer.

Figure 6:
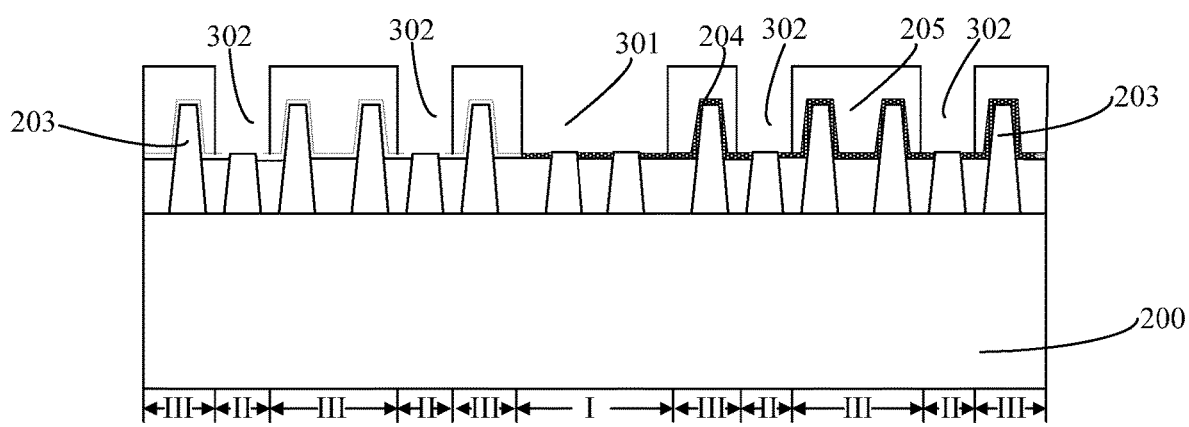

Returning to FIG. 12, after forming the first mask layer, a first opening and a second opening may be formed (S103). FIG. 6 illustrates a corresponding semiconductor structure.

As shown in FIG. 6, the first protection layer 204, the at least one first fin 201 and the at least one second fin 202 may be etched using the first mask layer 205 as a mask to form a first opening 301 in the at least one first fin 201 and a second opening 302 in the at least one second fin 202.

In one embodiment, the process for etching the first protection layer 204, the at least one first fin 201 and the at least one second fin 202 using the first mask layer 205 as a mask may be a dry etching process. In some embodiments, the process for etching the first protection layer, the at least one first fin and the at least one second fin using the first mask layer as a mask may be a wet etching process, etc.

After forming the first opening 301 and the second opening 302, the first mask layer 205 may be removed.

Figure 7:
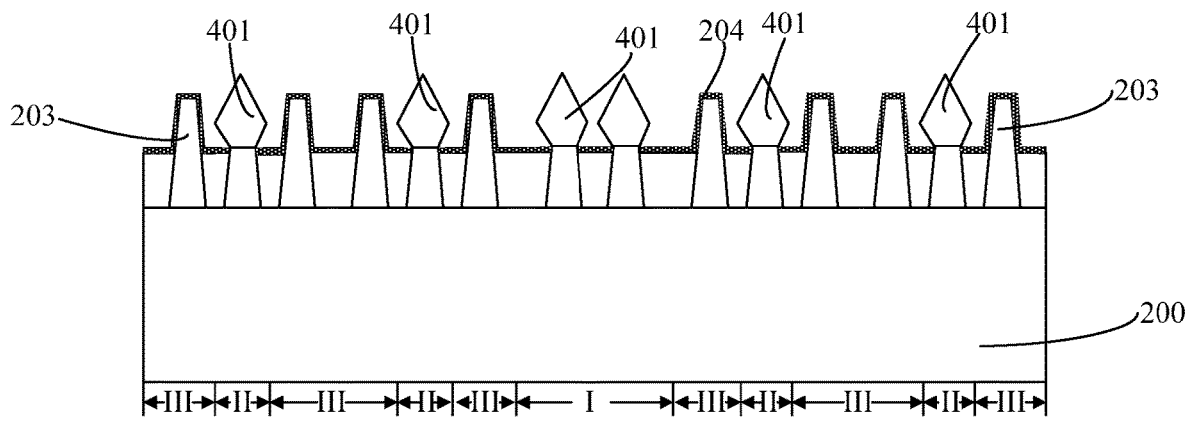

Returning to FIG. 12, after forming the first opening and the second opening, a first epitaxial layer may be formed (S104). FIG. 7 illustrates a corresponding semiconductor structure.

As shown in FIG. 7, a first epitaxial layer 401 may be formed in the first opening 301 and the second opening 302. In particular, the first epitaxial layer 401 may be formed on each of the at least one first fin 201 in the first opening 301 and each of the at least one second fin 202 in the second opening 302.

The process for forming the first epitaxial layer 401 may include a first epitaxial growth process. A first type of doping ions may be doped in the first epitaxial layer 401. The process for doping the first type of doping ions in the first epitaxial layer 401 may include an in-situ doping process. The first type of doping ions may be P-type ions, or N-type ions.

In one embodiment, the first type of doping ions are P-type ions, and the first epitaxial layer may be silicon germanium. The reaction gases of the first epitaxial growth process may include $SiH_4$, $GeH_4$, and $B_2H_6$, etc. The pressure of the reaction gases may be in a range of approximately 1 Torr to 100 Torr. The temperature of the first epitaxial growth process may be in a range of approximately 500° C.-800° C.

Because the first epitaxial layer 401 may also be formed on each of the at least one second fin 202 in the second opening 302, and the number of fins on which the first epitaxial layer 401 is form may be substantially large, the reaction gases for forming the first epitaxial layer 401 may be consumed rapidly; and the concentration of the reaction gases when the first epitaxial layer 401 is formed may be substantially low. Further, the material of the first epitaxial layer 106 may be silicon germanium. Thus, the growth rate of silicon germanium of the first epitaxial layer 401 along the <100> and <110> crystal directions may be slowed down. Accordingly, the formation of convex tips on the sidewalls of the first epitaxial layer 401 may be avoided; and the bridging issue of the first epitaxial layer 401 between adjacent first fins 201 may be avoided; and the performance of the semiconductor structure may be improved.

In one embodiment, a portion of or the first entire epitaxial layer 401 on the at least one second fin 202 may be subsequently removed, and a fourth opening may be formed in the at least one second fin 202. Further, a third opening may be subsequently formed in the at least one third fin 203. Moreover, in one embodiment, at least a portion of the first epitaxial layer 401 in the at least one second fin 202 may be removed while the third opening is formed in the at least one third fin 203. The process for forming the third opening and the fourth opening may be referred to FIGS. 8-10.

Figure 8:
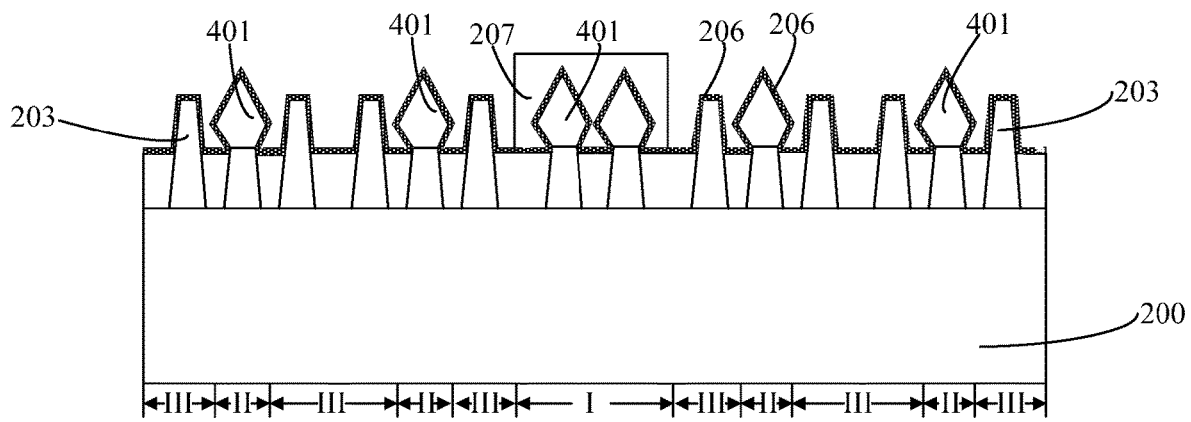

Returning to FIG. 13, after forming the first epitaxial layer, a second protection layer and a second mask layer may be formed (S105). FIG. 8 illustrates a corresponding semiconductor structure.

As shown in FIG. 8, a second protection layer 206 may be formed on the at least one first fin 201, the at least one second fin 202, and the at least one third fin 203. A second mask layer 207 may be formed on the second protection layer 206. The second mask layer 207 may expose a portion of the second protection layer 206 on the first epitaxial layer 401 in the at least one second fin 202 and a portion of the second protection layer 206 on the at least one third fin 203.

In one embodiment, the second protection layer 206 is silicon nitride; and the process for forming the second protection layer 206 may include a deposition process.

The purposes for forming the second protection layer 206 on the at least one first fin 201, the at least one second fin 202 and the at least one third fin 203 may be to protect certain regions. In particular, a third opening may be subsequently formed in the at least one third fin 203 and a fourth opening may be subsequently formed in the at least one second fin 202. When a second epitaxial layer is subsequently formed in the third opening and the fourth opening by a second epitaxial growth process, the region where the second epitaxial layer is not formed may be protected to by the second protection layer 206, and the damage to the at least one first fin 201 during in the second epitaxial growth process may be prevented.

In one embodiment, the second mask layer 207 may be a photoresist layer.

Figure 9:
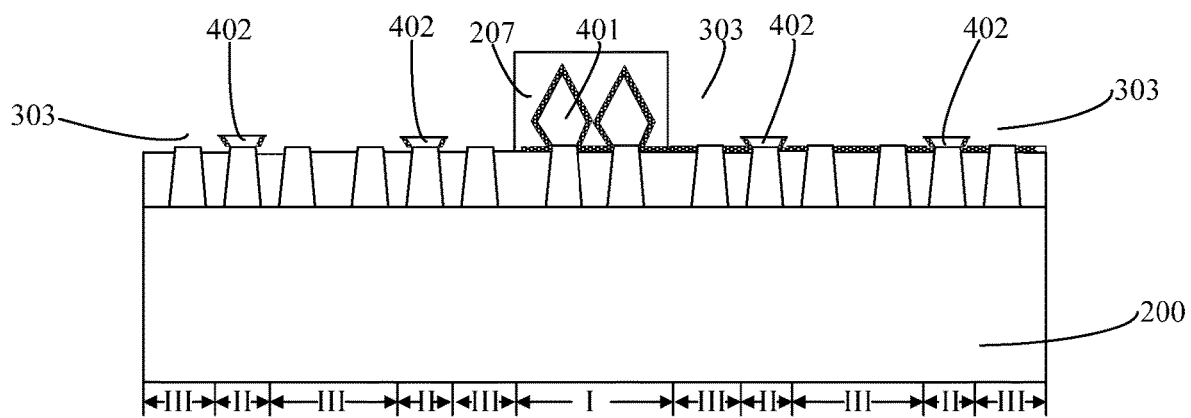

Returning to FIG. 12, after forming the second mask layer, a first etching process may be performed to form a remained first epitaxial layer and a third opening (S106). FIG. 9 illustrates a corresponding semiconductor structure.

As shown in FIG. 9, the second protection layer 206, the at least third fin 203 and a portion of the first epitaxial layer 401 in the at least one second fin 202 may be etched by a first etching process using the second mask layer 207 as a mask to form a remained first epitaxial layer 402 in the at least one second fin 202, and a third opening 303 is formed in the at least one third fin 203.

In one embodiment, the first etching process may include a dry etching process. In some embodiments, the second etching process may include a wet etching process, etc.

In one embodiment, the first etching process may remove portions of the first epitaxial layer 401 and the remained portions of the first epitaxial layer 401 may form the remained first epitaxial layer 402 in the at least one second fin 202.

Returning to FIG. 12, after forming the remained first epitaxial layer, a fourth opening may be formed (S107). FIG. 10 illustrates a corresponding semiconductor structure.

As shown in FIG. 10, a second etching process may be performed on the remained first epitaxial layer 402 to remove the remained first epitaxial layer 402 to form a fourth opening 304 in the at least one second fin 202.

In one embodiment, the second etching process may include a wet etching process. The etching solution of the wet etching process may include a hot hydrochloric acid solution. The hot hydrochloric acid may have a substantially high selectivity to the silicon germanium of the first epitaxial layer 401; and may be able to completely remove the remained first epitaxial layer 401 in the at least one second fin 202 and without damaging the at least one second fin 202 and the at least one third fin 203. Thus, the effect of the remained first epitaxial layer 401 in the at least one second fin 202 to the subsequent processes on the at least second fin 202 may be avoided.

In another embodiment, the second protection layer 206, the at least one third fin 203 and the entire first epitaxial layer 401 in the at least one second fin 202 may be etched using the second mask layer 207 as an etching mask to form a fourth opening 304 in the at least one second fin 202 and form a third opening 303 in the at least one third fin 203.

In one embodiment, the second protection layer 206, the at least one third fin 203 and the entire first epitaxial layer 401 in the at least one second fin 202 may be etched by a dry etching process.

In one embodiment, after the forming the third opening 303 and the fourth opening 304, the second mask layer 207 may be removed.

In one embodiment, a least a portion of the first epitaxial layer 401 in the at least one second fin 202 may be removed when the third opening 303 is formed in the at least one third fin 203. In particular, a portion of the first epitaxial layer 401 in the at least one second fin 202 or the entire first epitaxial layer 401 in the at least one second fin 201 may be removed when the third opening 303 is formed in the at least one third fin 203.

In some embodiments, the third opening 303 may be formed in the at least one third fin 203 before removing the at least a portion of the first epitaxial layer 401 in the second fin 202. In other embodiments, the third opening 303 may be formed in the at least one third fin 203 after the at least a portion of the first epitaxial layer 401 are removed. The process for forming the third opening 303 may include forming a third protection layer on the at least one first fin 201, the at least second fin 202, and the at least one third fin 203; forming a third mask on the third protection layer to expose a portion of the third protection layer on the at least one third fin 203; and etching the third protection layer and the at least one third fin using the third mask layer as a mask to form the third opening 303 in the at least one third fin 203.

Returning to FIG. 12, after forming the third opening and the fourth opening, a second epitaxial layer may be formed (S108). FIG. 11 illustrates a corresponding semiconductor structure.

As shown in FIG. 11, a second epitaxial layer 402 may be formed in the fourth opening 304 and the third opening 303. The second epitaxial layer 402 may be formed by a second epitaxial growth process.

The second epitaxial layer 402 may be doped with a second type of doping ions. The second epitaxial layer 402 may be doped with the second type of doping ions by an in-situ doping process. The second type of doping ions may include N-type ions, or P-type ions.

In one embodiment, the second type of doping ions may include N-type ions, and the second epitaxial layer 402 may be made of silicon carbide. The reaction gases of the second epitaxial process may include $SiH_4$, $CH_4$, and $AsH_3$, etc. The pressure of the reaction gases may be in a range of approximately 1 Torr to 100 Torr. The temperature of the second epitaxial growth process may be in a range of 500° C. to 800° C.

Thus, the volume of the first epitaxial layer 401 made of the silicon germanium formed in the at least one first fin 201 in the first region I along the <100> and <110> crystal directions may be controlled, and the first epitaxial layer 401 in the adjacent first fins 201 may be less likely to be bridged. Thus, the performance of the semiconductor structure may be improved.

The present disclosure also provides a semiconductor structure. FIG. 11 illustrates an exemplary semiconductor structure consistent with various disclosed embodiments of the present disclosure.

As shown in FIG. 11, the semiconductor structure may include a semiconductor substrate 200. The semiconductor substrate 200 may include at least one first region I, at least one second region II and at least one third region III. The at least one first region I, the at least one second region II, and the at least one third region III may be adjacent or alternatively distributed on the semiconductor substrate 200. At least one first fin 201 may be formed on the at least one first region I of the semiconductor substrate 200. At least one second fin 202 may be formed on the at least one second region II of the semiconductor substrate 200. At least one third fin 203 may be formed on the at least one third region III of the semiconductor substrate 200. Further, the semiconductor substrate may include a first epitaxial layer 401 formed in the at least one first fin 201; and a second epitaxial layer 403 formed in the at least one second fin 202 and the at least one third fin 203. The first epitaxial layer 401 in adjacent first fins 201 may not be bridged. The detailed structures and intermediate structures are described above with respect to the fabrication processes The technical solutions of the present disclosure may have at least the following beneficial effects.

In the disclosed method for forming a semiconductor structure, by forming a first epitaxial layer in the at least one first fin in the first region and a second epitaxial layer in the at least one second fin in the second region simultaneously, the number of fins having the first epitaxial layer being formed within may be increased, and the consumption of the reaction gases for forming the first epitaxial layer may be increased. Thus, the growth rate of the first epitaxial layer may be reduced, and the volume of the first epitaxial layer formed in the first region may be reduced. Accordingly, the case that the size of the first epitaxial layer formed in the first region along a direction parallel to the surface of the semiconductor substrate is substantially big to cause a bridging issue with the surrounding first epitaxial layer may be avoided. After forming the first epitaxial layer, the first epitaxial layer in the second region may be removed such that the first epitaxial layer formed on the second region does not interfere with the subsequent processes on the at least one second fin. Thus, the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
    a semiconductor substrate having at least one first region, a plurality of second regions and a plurality of third regions, wherein the at least one first region is between two adjacent third regions of the plurality of third regions, one third region of the plurality of third regions is between one second region of the plurality of second regions and the at least one first region, and one second region of the plurality of second regions is between two adjacent third regions of the plurality of third regions;
    at least one first fin formed on the at least one first region;
    at least one second fin formed on one second region of the plurality of second region;
    at least one third fin formed on one third region of the plurality of third regions;
    a first epitaxial layer formed at the at least one first fin, the first epitaxial layer being doped with P-type ions;
    a second epitaxial layer formed at the at least one second fin and the at least one third fin, the second epitaxial layer being doped with N-type ions;
    a protection layer encapsulating an entire outer surface, that is above the semiconductor substrate, of the first epitaxial layer, without being formed on the second epitaxial layer;
    the protection layer is further formed over the semiconductor substrate between adjacent fins provided by the at least one first fin, the at least one second fin, and the at least one third fin; and
    the protection layer further connects to each of the adjacent fins and has a top surface coplanar with a top surface of each adjacent fin that comprises one of the at least one first fin, the at least one second fin, and the at least one third fin.

2. The semiconductor structure according to claim 1, wherein:
    the first epitaxial layer is made of silicon germanium.

3. The semiconductor structure according to claim 1, wherein:
    the second epitaxial layer is made of silicon carbide.

4. The semiconductor structure according to claim 1, further comprising:
    a first gate structure across the at least one first fin;
    a second gate structure across the at least one second fin; and
    a third gate structure across the at least one third fin.

5. The semiconductor structure according to claim 1, further comprising:
    an isolation layer formed on the semiconductor substrate covering a portion of sidewalls of the at least one first fin, the at least one second fin, and the at least one third fin.

6. The semiconductor structure according to claim 5, wherein:
    the protection layer is further formed on the isolation layer.

* * * * *